United States Patent
Ikeda et al.

(10) Patent No.: US 6,825,614 B2
(45) Date of Patent: Nov. 30, 2004

(54) SHORT-ARC DISCHARGE LAMP

(75) Inventors: Naohisa Ikeda, Himeji (JP); Masanori Sugihara, Himeji (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/956,553

(22) Filed: Sep. 20, 2001

(65) Prior Publication Data

US 2003/0052606 A1 Mar. 20, 2003

(51) Int. Cl.$^7$ ............................................... H01J 17/18
(52) U.S. Cl. ......................................................... 313/623
(58) Field of Search ............................... 313/623–626, 313/634, 493, 334, 570

(56) References Cited

U.S. PATENT DOCUMENTS

| | | | | |
|---|---|---|---|---|
| 4,673,843 A | * | 6/1987 | Okanuma | 313/570 |
| 5,200,669 A | * | 4/1993 | Dixon et al. | 313/623 |
| 5,424,608 A | * | 6/1995 | Juengst et al. | 313/623 |
| 6,107,740 A | * | 8/2000 | Morimoto et al. | 313/625 |
| 6,262,535 B1 | * | 7/2001 | Dierks et al. | 313/623 |

FOREIGN PATENT DOCUMENTS

| | | |
|---|---|---|
| JP | 62-137553 U | 8/1987 |
| JP | 6-60960 U | 8/1994 |
| JP | 7-25559 U | 5/1995 |

* cited by examiner

Primary Examiner—Joseph Williams
Assistant Examiner—Peter Macchiarolo
(74) Attorney, Agent, or Firm—Nixon Peabody LLP; David S. Safran

(57) ABSTRACT

Short-arc discharge lamp designed to minimize the phenomenon of foil floating between the metal foil located in the foil sealing area and the sealing quartz component that is in contact with the inside of the metal foil so as to prevent cracks from forming in the foil sealing area, gas leakage from the lamp, and premature breaking of the lamp. The short-arc discharge lamp includes electrodes which are located in an emission space, a metal foil electrically connected to the electrodes, a quartz tube part which surrounds the metal foil, a sealing quartz component in contact with the inside of the metal foil, and a metallic component inserted into the sealing quartz component and electrically connected to the metal foil. The foil sealing area is formed from the metal foil, the quartz tube, and the sealing quartz component, which are sealed against one another. By the sealing action of the foil sealing area, sealing of the emission space is ensured. The short-arc discharge lamp has an electrical input power rating of greater than or equal to 4 kW and an operating pressure during luminous operation of greater than or equal to $2 \times 10^6$ Pa, and is operated using direct current. The above-mentioned characteristics are achieved in that the length of the area of a metallic component inserted into the sealing quartz component is greater than or equal to roughly 40% of the total length of the sealing quartz component.

8 Claims, 6 Drawing Sheets

| Lamp luminous pressure (x $10^6$ Pa) | Degree of formation of foil floating (%) |
|---|---|
| 1.9 | 0 |
| 2.0 | 20 |
| 2.4 | 25 |
| 2.6 | 30 |
| 2.8 | 25 |
| 3.0 | 100 |

Fig.5

SHORT-ARC DISCHARGE LAMP

BACKGROUND OF THE INVENTION

1. Field of the Invention

The invention relates to a short-arc discharge lamp for UV irradiation which, for example, is used in the production of semiconductors and liquid crystals. More particularly, the invention relates to a foil seal arrangement on the cathode side of a large short-arc discharge lamp.

2. Description of Related Art

Among short-arc discharge lamps for semiconductors and liquid crystals, large short-arc discharge lamps with an input electric power of, for example, greater than 1 kW are generally those that use foil sealing to ensure sealing of the discharge space. In short-arc lamps using this foil sealing, it is known that there is a defect in which a gas emerges from the foil sealing areas and destroys the lamps. An explanation for this defect is that the positive ions (i.e., cations) of metallic impurities, and the like, in the quartz glass are attracted by the negative electrical charge on the side of the cathode and in the foil sealing area on the side of the cathode, and that the positive ions concentrated on the cathode side and the foil sealing area detach the metal foil from the quartz tube part surrounding the metal foil. To eliminate this defect, an arrangement of a wire with the same electrical potential, which electrically connects on the outer surface of the quartz tube on the side of the cathode to the cathode, is implemented, as is described in Japanese patent disclosure HEI 4-40828 and its counterpart U.S. Pat. No. 4,673,843, for example, both of which are incorporated herein by reference.

FIG. 6 shows a conventional example of the arrangement of the foil sealing area on the cathode side of a short-arc discharge lamp with an input electrical power of greater than or equal to 1 kW, in which the above described wire with the same electrical potential is located. This lamp consists of the following:

- a bulb part 51 which jackets the emission space,
- a cathode 52 which is located in this bulb part 51;
- an inner lead pin 53 which is connected to the cathode 52;
- an inner lead pin holding component 54 which holds the inner lead pin 53 securely;
- a metal disk 55 which is connected to the end opposite the side of the cathode 52 of the inner lead pin 53;
- a metal foil 56 which is welded to the metal disk 55;
- a sealing quartz component 57 which is in contact with the inside of the metal foil 56;
- a quartz tube part 58 which is in contact with the outside of the metal foil 56;
- an outer lead pin 59;
- a metal disk 60 which connects the outer lead pin 59 and the metal foil 56 to one another;
- a foil sealing area 61 which ensures the sealing action of the lamp;
- a metal base 62;
- a line 63;
- a terminal part 64 which connects the line 63 to the above described lead pin; and
- a wire 65 which provides the same electrical potential between the metal base, which is electrically connected to the cathode 52, and the outer surface of the quartz tube.

For the metal foil 56, which is used for the foil sealing area 61, a strip-like foil with a thickness of a few tenths of a micron is used. The foil is made of a metallic material having a high melting point, such as molybdenum or the like. In the foil sealing area 61, the sealing action of an emission space is ensured by the metal foil 56. The sealing quartz component 57, which is in contact with the inside of the metal foil 56, and the quartz tube part 58, which is in contact with the outside of the metal foil 56, are located directly tightly adjacent to one another. The above-described defect is in the adhesion area, in which the metal foil 56 and the quartz tube part 58 which surrounds the metal foil are located directly tightly adjacent to one another, comes off. Specifically, the defect wherein positive ions of metallic impurities, and the like, in the quartz glass are attracted by the negative electrical charge on the side of the cathode 52 and are concentrated on the foil sealing area 61 on the side of the cathode 52, such that the positive ions concentrated on the foil sealing area 61 detach the metal foil 56 from the quartz tube part 58 that surrounds the metal foil 56, which is prevented by the use of a wire 65 which provides the same electrical potential to the outer surface of the quartz tube on the side of the cathode to the cathode by electrically connecting them, as described above.

According to increased market demand, the size and power rating of short-arc discharge lamps are becoming larger and larger. According to the input electrical power of the lamps of, for example, greater than 4 kW, the diameter and a length of the foil sealing area 61 shown in FIG. 6 are becoming larger and larger. For a lamp of this size, the operating pressure during luminous operation is greater than or equal to $2 \times 10^6$ Pa, which creates a new problem, i.e., that the foil floats between the metal foil 56 and the sealing quartz component 57 which is in contact with the inside of the metal foil 56.

SUMMARY OF THE INVENTION

An object of the invention is, therefore, to prevent the phenomenon of foil floating between the metal foil 56 located in the foil sealing area 61 and the sealing quartz component 57 in contact with the inside of the metal foil 56 in a large lamp with an electrical input power of greater than 4 kW and with an operating pressure during luminous operation of greater than or equal to $2 \times 10^6$ Pa.

It is another object of the invention to prevent cracks from forming in the foil sealing area 61, the leakage of gas from the lamp, and the premature breaking of the lamp during luminous operation.

Thus, in an embodiment of the present invention, there is provided a short-arc discharge lamp which includes:

- electrodes which are located in an emission space;
- a metal foil which is electrically connected to the electrodes;
- a quartz tube part which surrounds the above described metal foil;
- a sealing quartz component which is in contact with the inside of the metal foil;
- a metallic component which is inserted into the above described sealing quartz component and which is electrically connected to the metal foil; and
- a foil sealing area formed by the metal foil, the quartz tube and the sealing quartz component sealed against one another, and by which a sealing action of the above described emission space is ensured. The short-arc lamp has an electric input power greater of than or equal to 4 kW and an operating pressure during luminous operation of greater than or equal to $2\times10^6$ Pa, and is operated using direct current.

The above-mentioned characteristics of the invention are achieved by the length of the area of the metallic component inserted into the sealing quartz component being greater than or equal to roughly 40% of the total length of the sealing quartz component.

The object characteristics of the lamp of the present invention are furthermore achieved in that at least in one part of the foil sealing area on the cathode side there is an electrically conductive component which is electrically connected to the cathode along the outside surface of the quartz tube part.

Furthermore, it is another object of the invention to provide a short-arc discharge lamp that includes:

electrodes which are located in an emission space;

a metal foil which is electrically connected to the above described electrodes;

a quartz tube part which surrounds the above described metal foil;

a sealing quartz component which is in contact with the inside of the metal foil;

a metallic component which is inserted into the above described sealing quartz component and is electrically connected to the metal foil; and a foil sealing area formed by which the metal foil, the quartz tube and the sealing quartz component sealed against one another, and by which a sealing action of the above described emission space is ensured. The short-arc lamp has an operating pressure during luminous operation greater than or equal to $2\times10^6$ Pa, and is operated using direct current.

It is an object of the invention that the length of the area of the metallic component inserted into the sealing quartz component is greater than or equal to roughly 40% of the total length of the sealing quartz component, and that the diameter of the metallic component on the cathode side is less than the diameter on the side of the feed point and/or the diameter of the opening of the sealing quartz component for inserting the lead pin on the cathode side is greater than on the insertion opening side for the lead pin.

It is still another object of the invention to provide a short-arc discharge lamp which includes:

electrodes which are located in a emission space;

a metal foil which is electrically connected to the above described electrodes;

a quartz tube part which surrounds the above described metal foil;

a sealing quartz component which is in contact with the inside of the metal foil;

a metallic component which is inserted into the above described sealing quartz component and moreover is electrically connected to the metal foil; and a foil sealing area formed by the metal foil, the quartz tube and the sealing quartz component being sealed against one another, and by which a sealing action of the above described emission space is ensured.

It is another object of the invention to provide a short-arc lamp that has an operating pressure during luminous operation greater than or equal to $2\times10^6$ Pa, and which is operated using direct current, and further has a metal foil or a metal line is electrically connected to the cathode-side tip of an outer lead pin and that this metal foil or the metal line is inserted from a lead pin insertion opening side of the sealing quartz component as far as a position at which greater than or equal to roughly 40% of the total length is reached.

The invention address the problem defect of the foil floating phenomenon in the foil sealing area in a large lamp with an electric input power greater than or equal to 4 kW which results in the case of an operating pressure during luminous operation of greater than or equal to $2\times10^6$ Pa, in spite of using the above described wire with the same electrical potential.

It has been found that in the case of one such high luminous pressure on the inside surface of the foil of the sealing area the foil floating phenomenon arises. The object of the invention is to suppress the floating phenomenon on the inside surface of the metal foil and the sealing quartz component which is in contact with the inside of the metal foil.

As described, by inserting a metallic component, such as an outer lead pin or the like, as far as a position which comprises greater than or equal to roughly 40% of the total length of the sealing quartz component so as to prevent the concentration of positive ions on the inside surface of the metal foil. If the metallic component is inserted as far as a position which comprises greater than or equal to roughly 40% of the total length of the sealing quartz component, it receives heat from the cathode, by which the temperature of the metallic component rises and as a result of oxidation the volume of the metallic component expands. In this case, if the diameter of the outer lead pin insertion opening of the sealing quartz component is less than the outer lead pin which undergoes a volume expansion due to oxidation, a stress arises as a result of the volumetric expansion. As a result, cracks and the like are formed, which leads to breakage of the lamp. Therefore, there is provided a gap between the metallic component, such as the outer lead pin or the like, and the sealing quartz component and the gap absorbs the above described volumetric expansion to an adequate degree.

FIG. 5 shows the degree of formation of the foil floating phenomenon in the case of a high luminous pressure in a conventional lamp. In the case of a luminous pressure of $1.9\times10^6$ Pa there is no foil floating, while at a luminous pressure of greater than $2.0\times10^6$ Pa the foil floating phenomenon occurs with high probability. This foil floating phenomenon is formed on the inside of the foil. The invention is further described below using several embodiments shown in the drawings.

BRIEF DESCRIPTION OF THE DRAWINGS

FIG. 5 shows a table of the degree of formation of foil floating by the luminous pressure in a conventional short-arc discharge lamp an claimed in the invention.

DETAILED DESCRIPTION OF THE INVENTION

Figure 1:
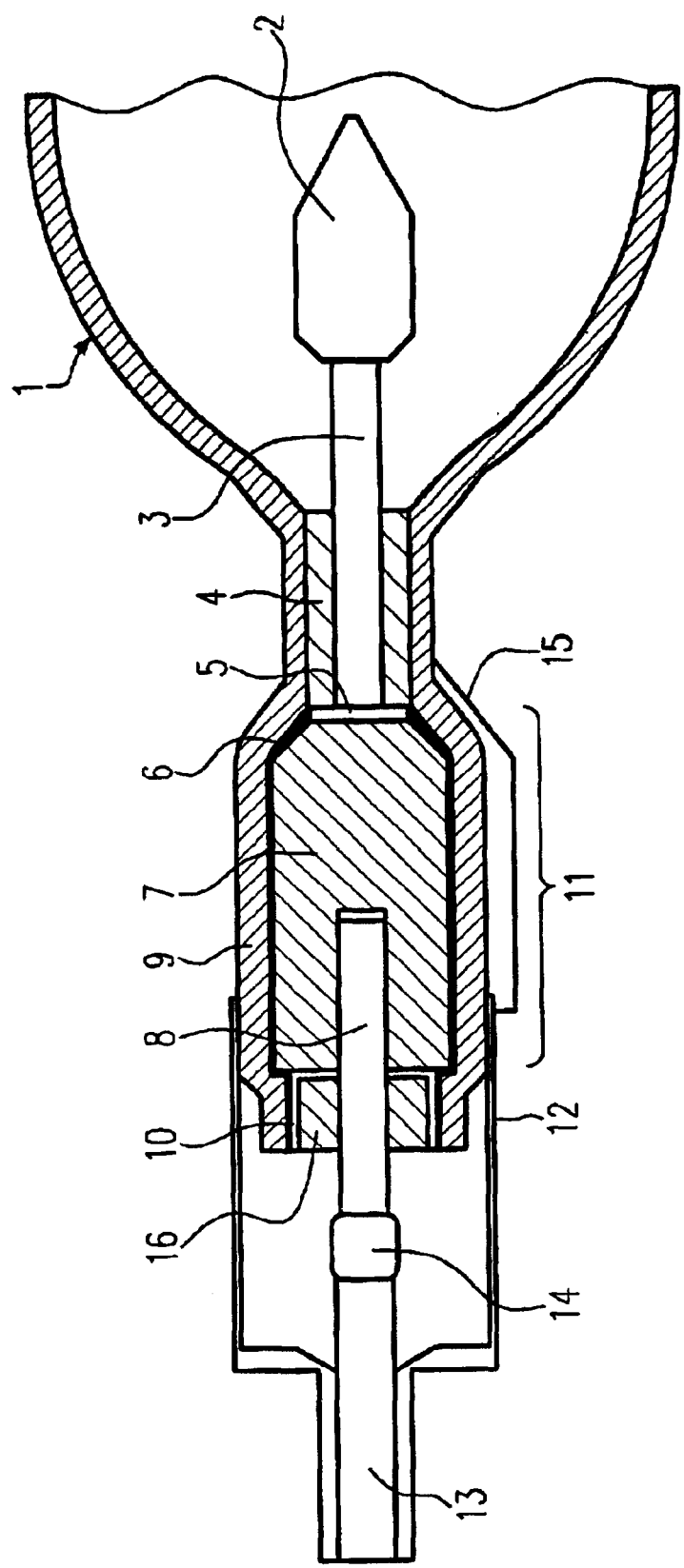
FIG. 1 shows a schematic of the arrangement of the sealing area in a short-arc discharge lamp as claimed in the invention.

FIG. 1 shows essentially the arrangement of the sealing area of a short-arc discharge lamp as claimed in the invention in a schematic. This lamp comprises the following:

- a bulb part 1 which jackets the emission space;
- a cathode 2 which is located in this bulb part 1;
- an inner lead pin 3 which is connected to the cathode 2;
- an inner lead pin holding component 4 which holds the inner lead pin 3 securely;
- a metal disk 5 which is connected to the end opposite the side of the cathode 2 of the inner lead pin 3;
- a metal foil 6 which is welded to the metal disk 5;
- a sealing quartz component 7 with a periphery which is provided with the metal foil 6;
- an outer lead pin 8;
- a quartz tube 9;
- a metal disk 10 which connects the outer lead pin 8 and the metal foil 6 to one another;
- a foil sealing area 11;
- a metal base 12;
- a line 13;
- a terminal part 14 which connects the line 13 to the lead pin 8; and
- a wire 15, which is a type of conductive component, for providing the same electrical potential to the outer surface of the quartz tube on the side of the cathode and to the cathode by electrically connecting them.

For the above described conductive component, a wire for providing the same electrical potential need not always be used, but rather, for example, a conductive coating layer, a metal plate or the like can be used.

In a first embodiment of the invention the outer lead pin 8 is inserted into at least 40% of the total length of the sealing quartz component 7. By this measure, the electrical potential of the sealing quartz component which is in contact with the inside of the metal foil 6 can be made as large as the electrical potential of the cathode 2. Thus, positive ions in the quartz glass can be prevented from concentrating on the inside of the metal foil 6 that is located in the vicinity of the sealing area 11. This can prevent the foil floating phenomenon which arises on the inside of the foil.

The invention relates not only to those sealing quartz components which are made in one piece, but also those in which the sealing quartz component 7 is composed of several individual parts of pieces. The expression "40% of the total length" is defined as the corresponding percentage which relates to the total length of the sealing area, regardless of whether the latter is in one piece or is assembled. This means that it is sufficient if the insertion depth of at least 40% is achieved with respect to the total length which is formed by the assembly of several components. Furthermore, the expression "sealing quartz component" is defined as a quartz component which is located nearer the electrode side than the metal disk 10. This expression does not include the outer lead pin holding quartz component 16.

Figure 4:
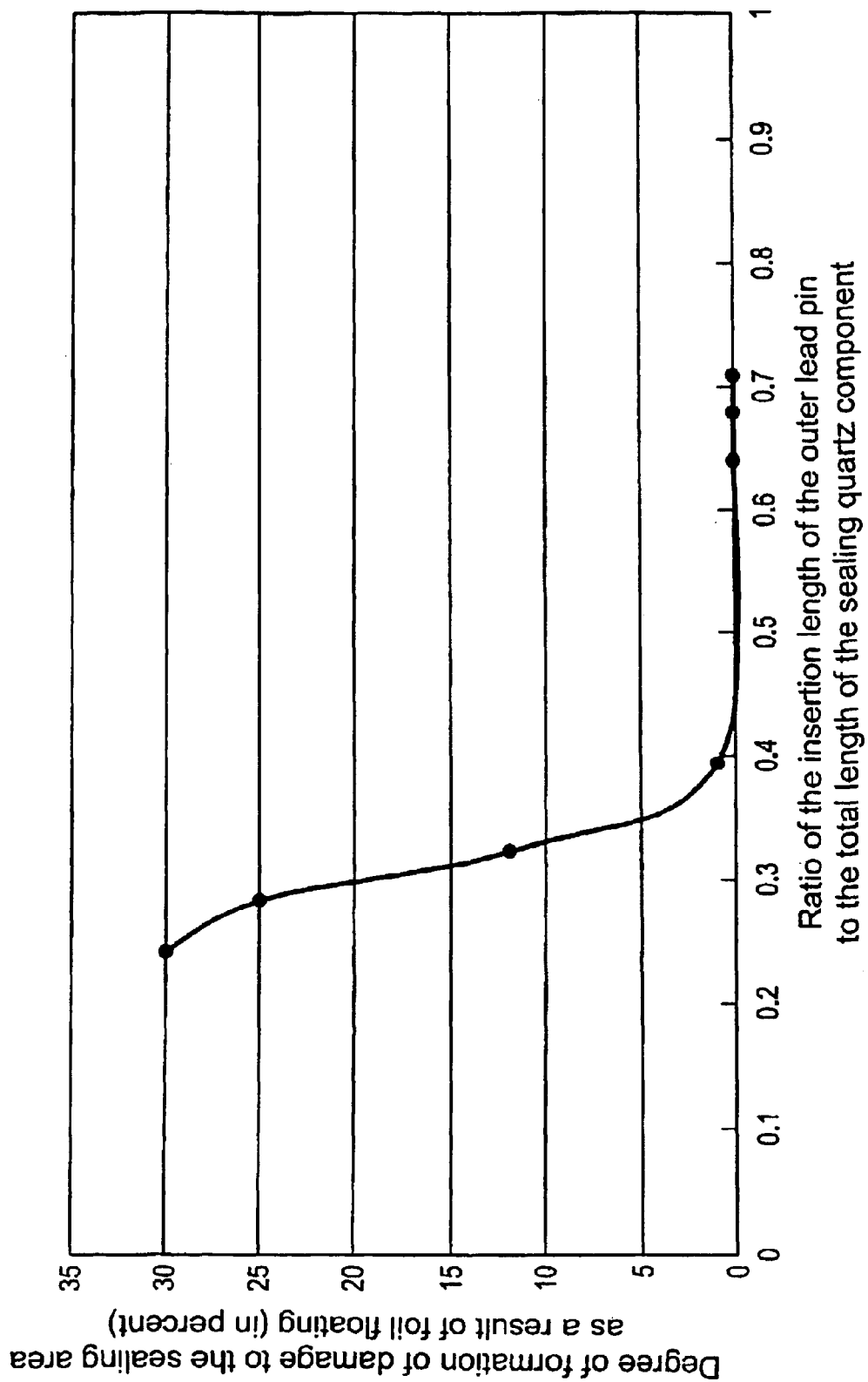
FIG. 4 shows a schematic of the relation between the ratio of the insertion length of the lead pin and the degree of formation of damage of the sealing area as a result of foil floating in a short-arc discharge lamp as claimed in the invention.
Figure 6:
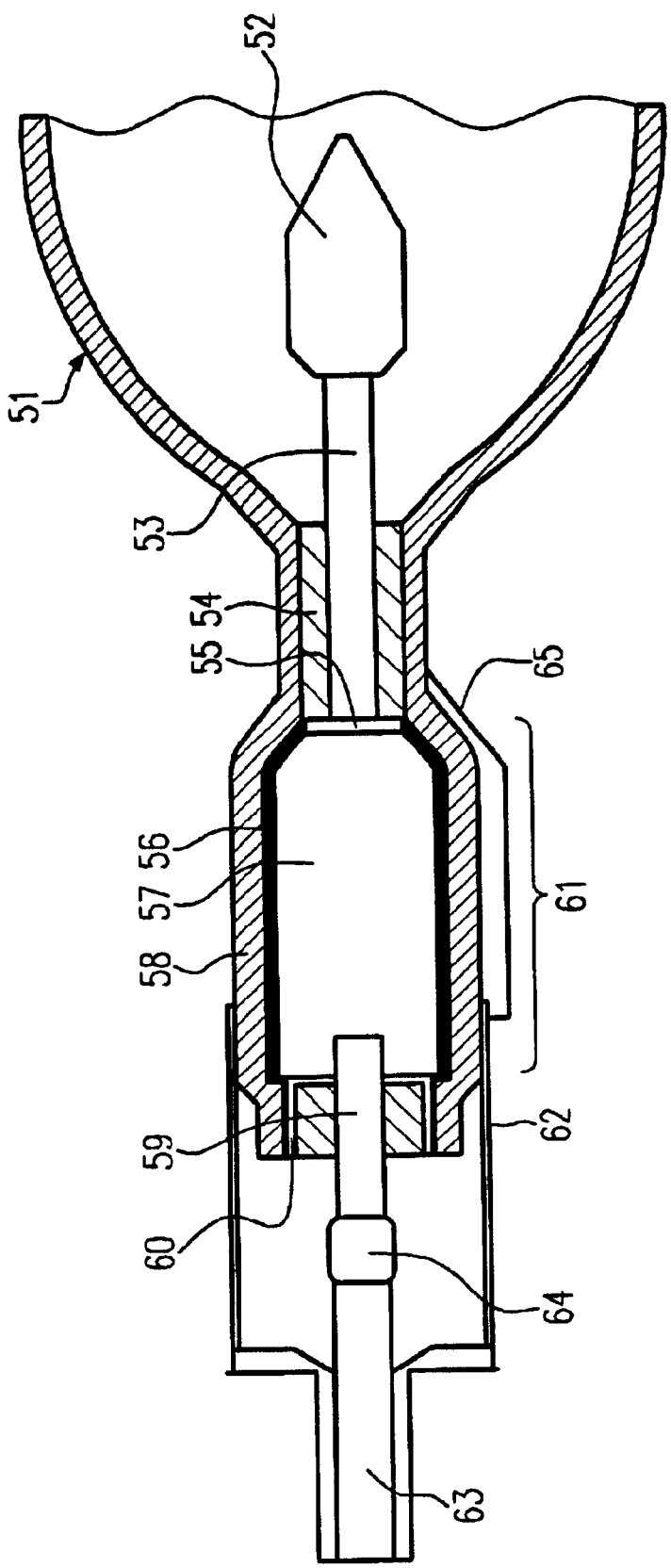
FIG. 6 shows a schematic of the arrangement of the sealing area in a conventional short-arc discharge lamp.

FIG. 4 shows the relation between the insertion length of the outer lead pin 8 into the sealing quartz component 7 and the degree of formation of damage to the sealing area by foil floating. Here the y axis plots the degree of formation, expressed in percentage, of damage to the foil sealing area by foil floating and the x axis plots the ratio of the insertion length of the outer lead pin 8 to the total length of the sealing quartz component 7 located in the foil sealing area 11, i.e. "insertion length of the outer lead pin"/"total length of the sealing quartz component". The drawings show that at a ratio of the insertion length of the outer lead pin 8 of greater than or equal to 0.4 the degree of formation of damage to the foil sealing area 11 by foil floating is almost 0, and that at a ratio of less than 0.4 damage to the foil sealing area 11 as a result of foil floating suddenly begins to form with high probability. This shows that the foil sealing area 11 must have an arrangement in which the ratio of the insertion length of the outer lead pin 8 to the total length of the sealing quartz component 7 is greater than or equal to 0.4, i.e. greater than or equal to 40%.

Figure 2:
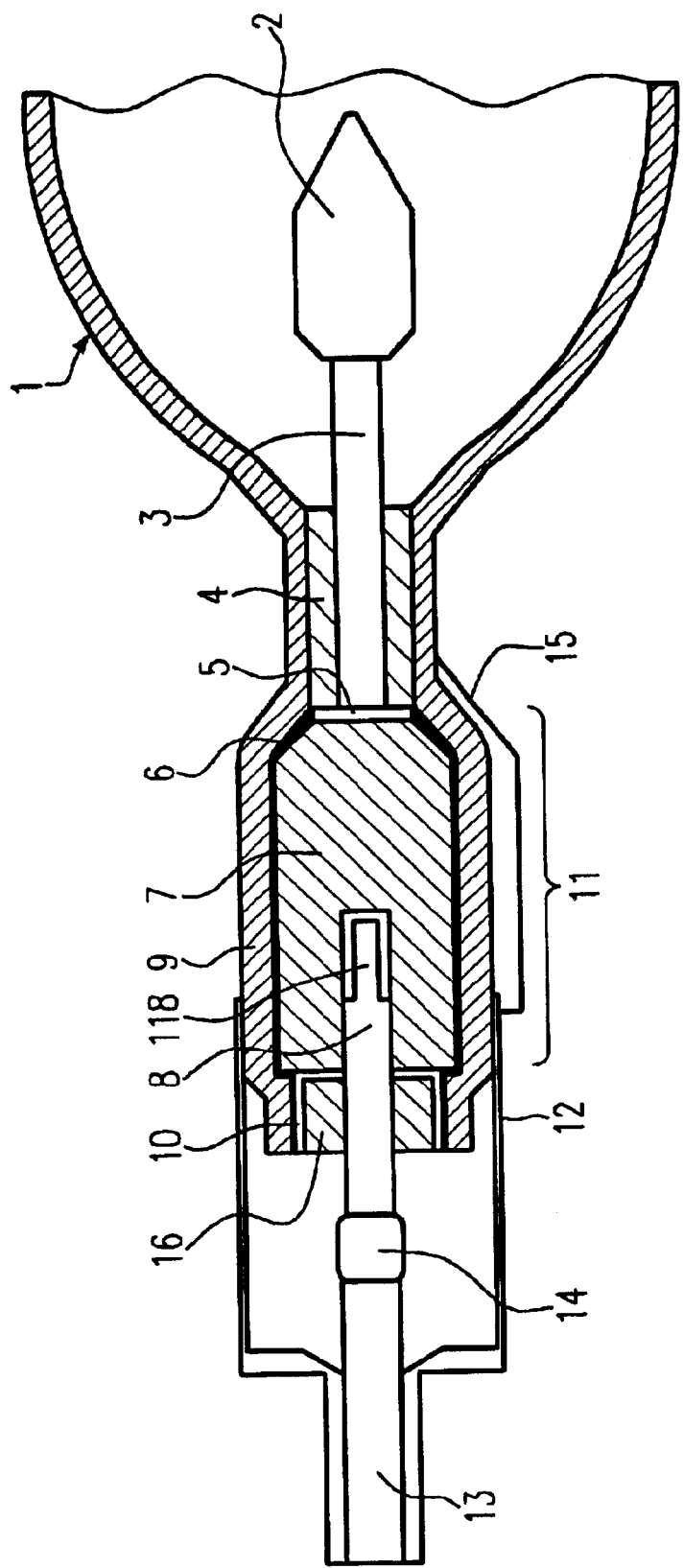
FIG. 2 shows a schematic of a second embodiment of the arrangement of the sealing area in a short-arc discharge lamp as claimed in the invention.

FIG. 2 shows a second embodiment of the invention. This lamp comprises the following:

- a bulb part 1 which encloses an emission space;
- a cathode 2 which is located in this bulb part 1;
- an inner lead pin 3 which is connected to the cathode 2;
- an inner lead pin holding component 4 which holds the inner lead pin 3 securely;
- a metal disk 5 which is connected to the end opposite the side of the cathode 2 of the inner lead pin 3;
- a metal foil 6 which is welded to the metal disk 5;
- a sealing quartz component 7 with a periphery which is provided with the metal foil 6;
- an outer lead pin 8;
- a quartz tube 9;
- a metal disk 10 which connects the outer lead pin 8 and the metal foil 6 to one another;
- a foil sealing area 11;
- a metal base 12;
- a line 13;
- a terminal part 14 which connects the line 13 to the lead pin 8;
- a wire 15 for providing the same electrical potential to the outer surface of the quartz tube on the side of the cathode and to the cathode by electrically connecting them; and
- a lead pin tip with a smaller diameter 118 which represents the cathode-side tip of the outer lead pin 8 and which is provided with a smaller diameter.

In the invention, the outer lead pin 8 is inserted at least to 40% with respect to the total length of the sealing quartz component 7. This means that the tip of the outer lead pin 8 is closer to the side of the cathode 2 than in a conventional short-arc discharge lamp. By this arrangement the outer lead pin 8 receives the effect of the heat produced by the cathode 2 and the temperature of the outer lead pin 8 increases. This temperature increase for large short-arc discharge lamps is significant, which result in cases in which the cathode side of the outer lead pin 8 is oxidized. As a result of this oxidation the volume of the cathode side of the outer lead pin 8 expands in the radial direction. As a result, the sealing quartz component 7 is exposed to a stress, wherein the sealing quartz component 7 cracks form, a gas emerges from the lamp and the lamp breaks.

In the second embodiment of the invention, a lead pin tip 118 with a smaller diameter is formed by the diameter of the outer lead pin 8 being reduced on the cathode side. To a sufficient degree, this measure yields a gap which prevents the action of the stress on the sealing quartz component 7 in spite of formation of volumetric expansion by oxidation. In this way, breaking of the lamp or the like is prevented.

The second embodiment of the invention as shown in FIG. 2 is described specifically below. The sealing quartz component 7 has a total length of 45 mm, a diameter on the side of the feed point of 23 mm, a diameter of the outer lead pin insertion opening 711 of 6.4 mm and a depth of this insertion opening 711 of 34 mm. The diameter of the outer lead pin 8 on the side of the feed point is 6 mm. The diameter of the outer lead pin 8 on the cathode side is 4 mm. The length of the area of the outer lead pin with the smaller diameter is 22 mm. In a short-arc discharge lamp in which there is a sealing quartz component 7 with this form factor, there are 5 sheets of strip-shaped metal foils 6 with a size of 61 mm×10 mm×40 microns. This short-arc discharge lamp is filled with 0.04 g/cc mercury. The emission space is filled with $1 \times 10^5$ xenon as the insert gas.

This lamp was subjected to a luminous test. During luminous operation with an electrical input power of 5 kW, even after 780 hours, neither foil floating nor cracking has resulted from the stress exerted by the outer lead pin 8 on the sealing quartz component 7. For the cathode side of the outer lead pin 8, an area which extends from the tip of the cathode side by roughly 10 mm is colored by oxidation. The outside diameter of the tip on the cathode side at the start of luminous operation was 4 mm, while it reached 4.15 mm as a result of volumetric expansion. The volumetric expansion of the outer lead pin as a metallic component due to oxidation is therefore 0.15 mm (diameter 4.15 mm–diameter 4 mm). In this embodiment of the invention, the stress exerted on the sealing quartz component 7 is adequately absorbed when a gap with a size of greater than or equal to 0.15 mm is present between the metallic component and the sealing quartz component.

Figure 3A:
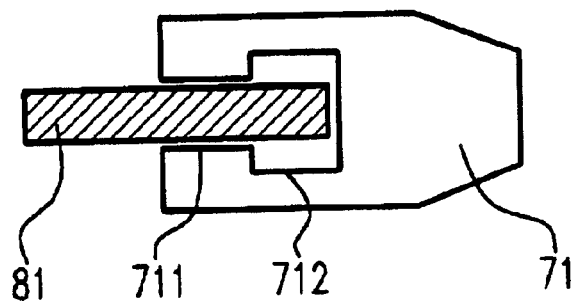
FIGS. 3(a), (b) and (c) show a schematic of various embodiments of the outer lead pin and of the holding quartz component in the invention.

FIGS. 3(a), (b) and (c) each show in an enlarged representation another embodiment of the arrangement of the outer lead pin and of the sealing quartz component in the invention. FIG. 3(a) shows an outer lead pin 81 made of a rod with a uniform diameter. Here, the diameter of the opening 712 on the electrode side of the insertion opening 711 of the sealing quartz component 71 into which the outer lead pin 81 is inserted is larger than the diameter of the other insertion opening 711. In this way, the outer lead pin 81 is inserted at least to 40% with respect to the total length of the sealing quartz component 71. Thus, positive ions of the quartz glass can be prevented from concentrating on the foil area. Furthermore, the fact that the opening 712 on the electrode side is greater than the diameter of the other insertion opening 711 prevents the outer lead pin 81 due to a temperature increase and the resulting oxidation from undergoing a volumetric expansion, thus a stress from being exerted on the sealing quartz component 71 and as a result cracks and breakage of the lamp are prevented.

Figure 3B:
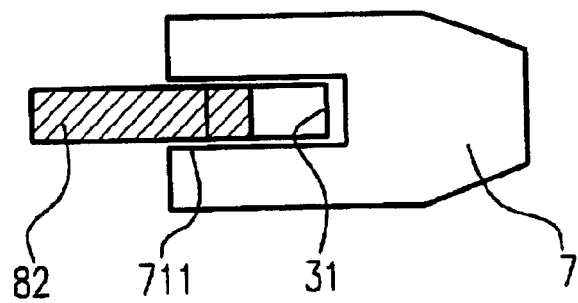

In FIG. 3(b), an outer lead pin 82 with a length which is roughly the same as in the conventional case is inserted into the outer lead pin insertion opening 711 which is formed in the sealing quartz component 7. A metal foil 31 is electrically connected to the cathode side of the outer lead pin 82. The position of the metal foil 31 on the cathode side which is inserted into the outer lead pin insertion opening 711 of the sealing quartz component 7 comprises at least 40% of the total length of the sealing quartz component 7. This arrangement can prevent concentration of positive ions in the quartz glass. Even if the cathode side area of the metal foil 31 as a result of oxidation due to the temperature increase undergoes a volumetric expansion, the metal foil can be easily deformed. This prevents a stress from being exerted on the sealing quartz component 7 and cracks from forming. Thus, leakage from the lamp and breakage of the lamp can be prevented.

Figure 3C:
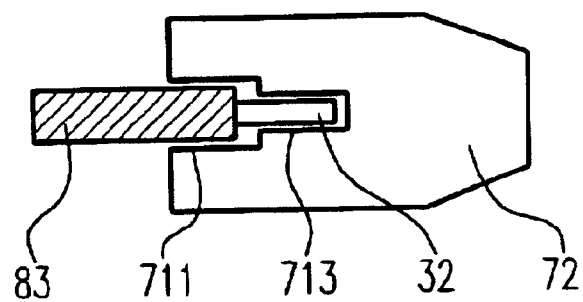

FIG. 3(c) shows a case in which, in the above described arrangement as shown in FIG. 3(b), instead of the metal foil 31, a metal line 32 is used. In the case of use of a metal line, wire or the like, the area on the side of the cathode 2 of the outer lead pin insertion opening 711 which is formed in the sealing quartz component 72 can be made smaller than the diameter of the outer lead pin 83. In this case, the exertion of stress on the sealing quartz component 72 is prevented when the diameter of the opening 713 on the electrode side is greater than the amount of volumetric expansion due to oxidation of the metal line. Thus the same effect as in FIG. 3(b) is obtained.

As set forth above, in a large short-arc discharge lamp with an electric input power of greater than or equal to 4 kW and an operating pressure during luminous operation of greater than or equal to $2 \times 10^6$ Pa, foil floating of the inside surface of the metal foil, which forms between the metal foil and the sealing quartz component in contact with the inside of the metal foil, is prevented. Furthermore, as set forth above, in the present invention, cracks can be prevented from forming in the foil sealing area. Moreover, gas leakage from the lamp through the cracks and breakage of the lamp can be prevented by the present invention, even if the metallic component which is used to prevent foil floating, such as a metal rod, a metal foil, a metal line or the like, is subjected to oxidation expansion by the heat received from the cathode side.

Having now fully described the invention, it will be apparent to one ordinary skill in the art that many changes and modifications can be made thereto without departing from the spirit or scope of the invention as set forth herein.

What we claim is:

1. Short-arc discharge lamp operable by direct current, comprising:

anode and cathode electrodes located in an emission space;

a metal foil electrically connected to the electrodes;

a quartz tube part which surrounds the metal foil;

a sealing quartz component in contact with an inner side of the metal foil, said sealing quartz component having an insertion opening;

a metallic component inserted into the quartz tube part and electrically connected to the metal foil; and a foil sealing area formed by the metal foil, the quartz tube part and the sealing quartz component sealed against one another, wherein an area of the metallic component inserted into the sealing quartz component has a length that is at least equal to 40% of the total length of the sealing quartz component, and wherein the lamp has an electric input power at least equal to 4 kW and an operating pressure during luminous operation at least equal to $2 \times 10^6$ Pa; wherein the metallic component comprises a lead pin having a feed point side and a cathode side, and wherein the diameter of the lead pin on the cathode side is smaller than the diameter on the side of the feed point, said feed point side and said cathode side of said lead pin being positioned within said insertion opening to form a gap between said lead pin and said sealing quartz component within said insertion opening.

2. Short-arc discharge lamp as claimed in claim 1, further comprising an electrically conductive component which is electrically connected to the cathode electrode, said electrically conductive component being located along an outside surface of the quartz tube part in at least part of the foil sealing area on a cathode side.

3. Short-arc discharge lamp as claimed in claim 1, wherein the metallic component comprises a lead pin, wherein the sealing quartz component further comprises a cathode-side opening in communication with said insertion opening for accommodating the lead pin, and wherein the cathode-side opening has a diameter that is larger than the diameter of the insertion opening.

4. Short-arc discharge lamp as claimed in claim 1, comprises an outer lead pin and one of a metal foil and a metal line which is connected to a cathode-side tip of the outer lead pin.

5. Short-arc discharge lamp as claimed in claim 1, the feed point side of the lead pin extends axially outward from said quartz tube part.

6. Short-arc discharge lamp operable by direct current, comprising:
   anode and cathode electrodes located in an emission space;
   a metal foil electrically connected to the electrodes;
   a quartz tube part which surrounds the metal foil;
   a sealing quartz component in contact with an inner side of the metal foil;
   a metallic component inserted into the quartz tube part and electrically connected to the metal foil; and
   a foil sealing area formed by the metal foil, the quartz tube part and the sealing quartz component sealed against one another,
   wherein an area of the metallic component inserted into the sealing quartz component has a length that is at least equal to 40% of the total length of the sealing quartz component, and wherein the lamp has an electric input power at least equal to 4 kW and an operating pressure during luminous operation at least equal to $2 \times 10^6$ Pa; wherein the metallic component comprises a lead pin, wherein the sealing quartz component comprises a cathode-side opening and an insertion opening which are in communication with one another for accommodating the lead pin, the cathode side opening being closer to the cathode than the insertion opening and wherein the cathode-side opening has a diameter that is larger than the diameter of the insertion opening.

7. Short-arc discharge lamp as claimed in claim 6, further comprising an electrically conductive component which is electrically connected to the cathode electrode, said electrically conductive component being located along an outside surface of the quartz tube part in at least part of the foil sealing area on a cathode side.

8. Short-arc discharge lamp as claimed in claim 6, comprises an outer lead pin and one of a metal foil and a metal line which is connected to a cathode-side tip of the outer lead pin.

* * * * *